United States Patent [19]

Ogawa et al.

[11] Patent Number: 5,434,125
[45] Date of Patent: Jul. 18, 1995

[54] RARE EARTH OXIDE SUPERCONDUCTING MATERIAL AND PROCESS FOR PRODUCING THE SAME

[75] Inventors: Naoyuki Ogawa, Anjo; Takenobu Sakai, Susono; Izumi Hirabayashi, Nagoya, all of Japan

[73] Assignees: International Superconductivity Technology Center, Tokyo; NGK Insulators, Ltd., Nagoya; Toyota Jidosha Kabushiki Kaisha, Toyota, all of Japan

[21] Appl. No.: 257,432

[22] Filed: Jun. 8, 1994

Related U.S. Application Data

[63] Continuation of Ser. No. 89,591, Jul. 12, 1993, abandoned, which is a continuation of Ser. No. 808,809, Dec. 18, 1991, abandoned.

[30] Foreign Application Priority Data

Dec. 20, 1990 [JP] Japan .................................. 2-412529

[51] Int. Cl.$^6$ ........................ C04B 35/43; H01B 12/00
[52] U.S. Cl. ................................ 505/126; 505/450; 505/781; 505/785; 505/125; 264/56; 232/521; 232/518; 301/152; 301/123
[58] Field of Search ............... 505/126, 450, 781, 785; 264/56; 232/521, 518; 501/152, 123

[56] References Cited

FOREIGN PATENT DOCUMENTS

| | | |
|---|---|---|
| 319807 | 6/1989 | European Pat. Off. . |
| 0319807 | 6/1989 | European Pat. Off. . |
| 0374263 | 6/1990 | European Pat. Off. . |
| 2-153803 | 6/1990 | Japan . |
| 009344 | 8/1990 | WIPO . |

OTHER PUBLICATIONS

Morita et al, "Effect of Platinum Addition on Melt Processed Yttrium Borrin Copper Oxide Superconductors" Jap. Joun. Apply. Phys. Part 2, 30(5A) pp. 2813-2815 May 1991.
Tiefel et al "Recovery of High-Tc Superconductivity in Y-Ba-Cu-O Dope With Reacting Metals", Physica C 166 pp. 408-412, 1990 no month.
Patent Abstracts of Japan vol. 13, No. 268 May 16, 1989.
Patent Abstracts of Japan, vol. 13, No. 208, May 16, 1989.
World Patents Index Latest, Week 8931, Derwent Publications Ltd., London, GB; AN 89-224375. No month (1989).
World Patents Index Latest, Week 8916, Derwent Publications Ltd., London, GB; AN 89-117172. No month (1989).

*Primary Examiner*—Mark L. Bell
*Assistant Examiner*—C. M. Bonner
*Attorney, Agent, or Firm*—Ronald J. Kubovcik

[57] ABSTRACT

A rare earth oxide superconducting material represented by $REBa_2 2Cu_3O_y$ (RE is Y, Gd, Dy, Ito, Er or Yb), comprises oxide grains and at least one element selected from Rh and Pt, uniformly dispersed in the grain in a proportion of 0.01-5% by weight (in terms of element) based on the rare earth oxide superconducting material. The rare earth oxide superconducting material can be produced by a melt processing and gives a high critical current density even in a highly magnetic field.

13 Claims, 1 Drawing Sheet

RARE EARTH OXIDE SUPERCONDUCTING MATERIAL AND PROCESS FOR PRODUCING THE SAME

This application is a continuation of application Ser. No. 08/089,591 filed Jul. 12, 1993 (now abandoned), which is a continuation of Ser. No. 07/808,809, filed Dec. 18, 1991, (now abandoned).

BACKGROUND OF THE INVENTION AND THE RELATED ART STATEMENT

The present invention relates to a rare earth oxide superconducting material and a process for producing said superconducting material. More particularly, the present invention relates to a rare earth oxide superconducting material which comprises grains of an oxide superconducting material represented by $REBa_2Cu_3O_y$ (RE is Y, Gd, Dy, Ho, Er or Yb) and at least one element selected from Rh and Pt, uniformly dispersed in said grain and which gives a high critical current density even in a highly magnetic field, as well as to a process for producing said superconducting material by melting the raw materials.

Oxide superconducting materials have high critical temperatures and vigorous researches are under way in order to put them into practical use. In obtaining an oxide superconducting material as a bulk material, sintering has heretofore been used generally. The oxide superconducting materials obtained by sintering have such a microstructure as the grains: are fine and a number of grain boundaries exist inside; when observed under an optical microscope, they show, in some cases, the presence of cracks along the grain boundaries and impurities at the grain boundaries. In these oxide superconducting materials obtained by sintering, the superconducting grains are combined with each other by a weak-link, and the critical current density (Jc) is controlled by the weak-link, making it impossible to obtain a high Jc.

Meanwhile, in superconducting materials of single crystal structure, it is known that no grain boundary problems as mentioned above exist and that a high Jc is obtained even in a highly magnetic field. Hence, it was investigated to allow the superconducting material of microstructure obtained by sintering to approximate a single crystal structure and it was proposed to disperse microstructure particles of superconducting phase in a single crystal phase to fix the magnetic flux line coming into, that is, to form pinning centers. For example, a melting process represented by a MTG process (a Melt Textured Growth process) was proposed. In the MTG process, a rare earth oxide superconducting material, for example, is slowly cooled generally from the Incongruent melting point of 123 phase [$REBa_2Cu_3O_y$ (RE is a rare earth element including Y)] to give rise to a peritectic reaction between 211 phase ($RE_2BaCuO_5$) and liquid phase to cause crystal growth; the 211 phase exists inside the crystals because of incomplete reaction after growth and acts as pinning centers; as a result, the rare earth oxide superconducting material obtained shows a high Jc even in a magnetic field. The oxide superconducting material obtained by the MTG process, however, has various disadvantages in that the particles of the 211 phase are large and their distribution is non-uniform and that cracks exist along the direction of crystal growth.

Also, a CG process (a Quench and Melt Growth process) was proposed in Japanese Patent Application Laid-Open No. 153803/1990, as an improved process for the MTG process. In tile QMG process, raw materials for rare earth oxide superconducting material are subjected to melting, quenching and solidification to obtain an intermediate comprising a Ba-Cu oxide phase and an $Y_2O_3$ phase or the like of 50 $\mu$m or less dispersed in said oxide phase, or $Y_2O_3$ and a Ba-Cu oxide are mixed to obtain a plate-like material of 5 mm or less in thickness or a linear material; the intermediate or the plate-like or linear material is heated at the incongruent melting point of 123 phase to convert to a semi-molten state and then is cooled slowly from that temperature at a given cooling rate to give rise to a peritectic reaction between 211 phase and liquid phase to grow a 123 phase in which a 211 phase of 20 mm or less is finely and uniformly dispersed. According to the disclosure in the above document, the superconducting material obtained by the QMG process exhibits a very high pinning effect and gives an excellent Jc in a highly magnetic field. Further, a MPMG process (a melt powder and melt growth process) was proposed. In the MPMG process, a material obtained by melting, quenching and solidification according to the QMG process is ground for higher shapability and the obtained superconducting material is said to give the same high Jc as In the QMG process.

The QMG process and the MPMG process, as compared with the melt processing, can exhibit a high pinning effect and give an excellent Jc, but must conduct melting in two stages making the procedure complex.

SUMMARY OF THE INVENTION

An object of the present invention is to provide a rare earth oxide superconducting material showing, similarly to the oxide superconducting materials obtained by the QMG process and tile MPMG process, a very high pinning effect and an excellent Jc in a highly magnetic field.

Another object of the present invention is to provide a process for producing a rare earth oxide superconducting material showing an excellent Jc, by a melt processing employing a simple procedure.

According to the present invention, there is provided a rare earth oxide superconducting material represented by $REBa_2Cu_3O_y$ (RE is Y, Gd, Dy, flo, Er or Yb), comprising oxide grains and at least one element selected from Rh and Pt, contained in said grains in a proportion of 0.01–5% by weight (in terms of element) based on the rare earth oxide superconducting material.

According to the present invention, there is also provided a process for producing a rare earth oxide superconducting material represented by $REBa_2Cu_3O_y$ (RE is Y, Gd, Dy, Ho, Er or Yb), comprising oxide grains and at least one element :selected from Rh and Pt, contained in said grains in a proportion of 0.01–5% by weight (in terms of element) based on tile rare earth oxide superconducting material, which process comprises adding, to powders containing RE. Ba and Cu [these powders are raw materials for $REBa_2Cu_3O_y$, at least one element selected from Rh and Pt or at least one compound thereof so that the addition amount becomes 0.01–5% by weight (in terms of element) based on the rare earth oxide superconducting material to be finally obtained, shaping the resulting mixture, subjecting the shaped material to a heat treatment at a temperature equal to or higher than the lncongruent melting point of the $REBa_2Cu_3O_y$ oxide superconducting material, and subjecting the resulting material to slow cooling and a heat treatment.

In the present invention, at least one element selected from Rh and Pt or at least one compound thereof is added to raw materials for $REBa_2Cu_3O_y$ oxide superconducting material, whereby the resulting oxide superconducting material contains Rh and/or Pt in a uniformly dispersed state, shows a high Jc similarly to the oxide superconducting materials obtained by the QMG process and the MPMG process, and is uniform in every portion and exhibits excellent superconductivity.

The process for producing a rare earth superconducting material according to the present invention conducts melting in one stage as in the conventional melting process and can provide a rare earth oxide superconducting material having excellent superconductivity.

The $REBa_2Cu_3O_y$ oxide superconducting material according to the present invention can be obtained by adding given amount(s) of platinum group element(s) or compounds(s) thereof to raw material powders and then subjecting the resulting mixture to melting, slow cooling and heat treatment in substantially the same manners as in the conventional melt processing. The $REBa_2Cu_3O_y$ oxide superconducting material containing given amount(s) of platinum group element(s) in a uniformly dispersed state, obtained according to the present invention exhibits uniform superconductivity in every portion, as compared with the rare earth oxide superconducting materials lacking in overall uniformity, obtained by the conventional melt processing, and gives a high Jc even in a highly magnetic field similarly to the rare earth oxide superconducting materials obtained by the conventional melt processing. These features, although tile reasons are not clear, are brought about by the use of given amount(s) of platinum group element(s) or compound(s) thereof as a material and have been found by the present inventors for the first time.

BRIEF DESCRIPTION OF TIlE DRAWINGS

DETAILED DESCRIPTION OF THE INVENTION

Figure 1:
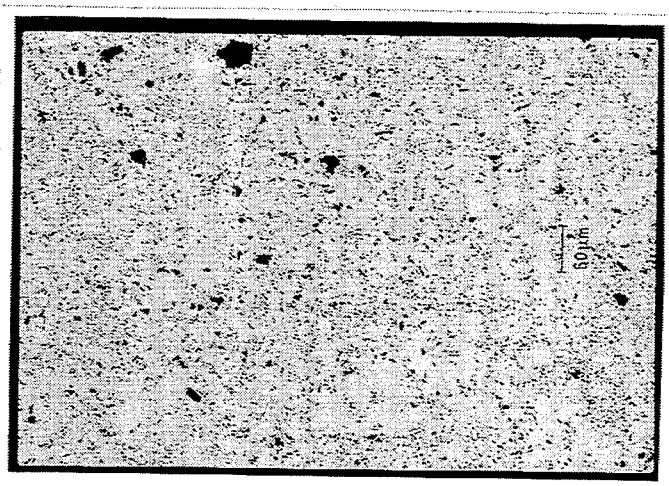
FIG. 1 is a microphotograph showing the microstructure of the crystals of an example of the rare earth oxide superconducting material of the present invention.

The present invention is hereinafter described in detail.

The $REBa_2Cu_3O_y$ oxide superconducting material of the present invention has a multi-layered perovskite structure containing, as a rare earth element (RE), Y, Gd, Dy, Ho, Er or Yb and is represented by, for example, $YBa_2Cu_3O_7$.

The raw material powders containing RE, Ba ad Cu elements used for obtaining the $REBa_2Cu_3O_y$ oxide superconducting material have no particular restriction as long as they are a mixed oxide powder of an oxide of RE (i.e. Y, Gd, Dy, Ito, Er or Yb), a carbonate or oxide of Ba and an oxide of Cu, a calcined powder obtained from said mixed oxide powder, a frit powder obtained from said mixed oxide powder, or the like, in which powder the individual raw materials are contained so as to constitute, after firing, $REBa_2Cu_3O_3$ and $RE_2BaCuO_6$. The particle diameters of the raw material powders have no particular restriction, either, but is generally 2-20 $\mu m$.

In the present invention, at least one platinum group element selected from Rh and Pt or at least one compound thereof (e.g. $PtO_2$) is added to the above raw material powders in a proportion of 0.01-5% by weight (in terms of element) based on the $REBa_2O_3O_y$ oxide superconducting material to be obtained finally, to obtain a mixed powder. Addition of a single metal powder of Rh or Pt is generally preferred. When the platinum group element or compound thereof is added in a proportion less than 0.01% by weight (in terms of element) based on the $REBa_2O_3O_6$ oxide superconducting material to be obtained finally, no effect is obtained by the addition. When the addition proportion is more than 5% by weight, impurities appear in a larger amount and an undesirable effect is incurred. The platinum group element or compound thereof is added to the raw material powders for rare earth oxide superconducting material, preferably in the form of powder for easier mixing. Addition in a fine powder having particle diameters of about 20 $\mu m$ or less is preferred generally. When the particle diameters are more than about 20 $\mu m$, the powder remains in the final product as agglomerates, reducing the homogeneity of the final product. The reduction in homogeneity causes fluctuation of superconductivity.

The mixed powder consisting of the raw material powders and tile platinum group element or compound thereof is thoroughly mixed to uniformly disperse the element or compound in the raw material powders; the resulting powder is shaped into a desired shape; the shaped material is heated to a temperature equal to or higher than the incongruent melting point of tile $REBa_2Cu_3O_y$ oxide superconducting material to be obtained finally; the resulting material is cooled slowly as in the known melting process and then subjected to a heat treatment in an oxygen atmosphere to obtain a rare earth oxide superconducting material of the present invention.

The shaping can be conducted according to a known method such as doctor blade method, press molding method, casting method or the like, to obtain a shaped material as a bulk material of rare earth oxide superconducting material. It is also possible to obtain a shaped material by spray- or powder-coating the above-mentioned mixed powder on a substrate made of a metal, a ceramic or the like to form a layer of rare earth oxide superconducting material on the substrate.

The temperature equal to or higher than the incongruent melting point of desired rare earth oxide superconducting material, used in the present invention varies depending upon the kind of the RE component (either of Y, Gd, Dy, Ho, Er or Yb) employed. Said temperature is about 1000°–1200° C. when the RE component is Y, about 1050°–1250° C. when the RE component is Gd, about 1000°–1200° C. when the RE component is Dy, about 1000°–11500° C. when the RE component is Ho, about 950°–11000° C. when the RE component is Er, and about 900°–1100° C. when the RE component is Yb. Said temperature can be appropriately selected within the above range, depending upon the kind of tile RE component used, the heating conditions employed, the size of the shaped material prepared, etc. The heating is conducted by keeping the shaped material in the above temperature range for a given length of time. The time is not particularly restricted and, similarly to the temperature range, can be appropriately selected depending upon the heating conditions employed, etc. The time is 20 minutes to 2 hours generally.

The material after heating is cooled slowly as in the conventional melting process and then subjected to a heat treatment in an oxygen atmosphere at a given temperature to obtain a $REBa_2Cu_3O_y$ oxide superconducting material. The cooling is conducted at a cooling rate of preferably about 1°–5° C./hr. The heat treatment is preferably conducted in an oxygen atmosphere generally at 650°–400° C. for about 10–50 hours.

EXAMPLES

The present invention is hereinafter described in more detail with reference to Examples. However, the present invention is by no means restricted by the following Examples.

Example 1

Powders of $Y_2O_3$, $BaCO_3$ and CuO were mixed so that the atomic ratio of Y, Ba and Cu became 1.50: 2.25: 3.25. The mixture was calcined at 800° C. for 10 hours. The calcined product was ground in Isopropyl alcohol in a rotary mill containing zirconia flint pebbles, for 15 hours to obtain a calcined powder having an average particle diameter of about 5 mm.

To the calcined powder was added a platinum (Pt) powder having an average particle diameter of about 3 μm, so that the fired body (oxide superconducting material) has the content of Pt in term of element as shown in Table 1; the mixture was made uniform in Isopropyl alcohol in the same rotary mill using zirconia flint pebbles.

Each of the resulting mixed powders was press-molded to obtain pellets of 7 mm in thickness and 20 mm in diameter.

The pellets were placed in an electric furnace containing the air and kept at 1150° C. for 1.5 hours to give rise to Incongruent melting point. Each of the resulting materials was cooled slowly from 1020° C. to 920° C. in 80 hours, and then heat-treated at 500° C. for 24 hours with the atmosphere in the furnace changed to oxygen to obtain oxide superconducting materials each in pellet form.

Figure 2:
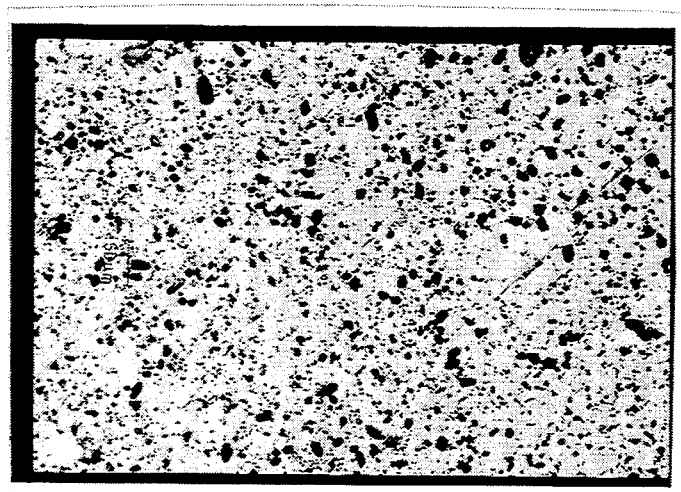
FIG. 2 is a microphotograph showing the microstructure of the crystals of a rare earth oxide superconducting material obtained by the conventional process.

The oxide superconducting materials each in pellet form were polished and observed under an optical microscope. FIG. 1 is a microphotograph showing the microstructure of the crystals of the oxide superconducting material of sample No. 1-12, and FIG. 2 is a microphotograph showing the microstructure of tile crystals of the superconducting material of sample No. 1-1 containing no platinum powder. In FIG. 1, the white matrix is an $YBa_2Cu_3O_y$ superconducting material and the fine black spots dispersed in the matrix is an $Y_2BaCuO_5$ non-superconducting material. Meanwhile, in FIG. 2, the black portions which are an $Y_2BaCuO_5$ superconducting material have larger particle diameters than in FIG. 1 and are dispersed non-uniformly.

Five pellets were selected at random from each oxide superconducting material, and about 100 mg each was cut out from the pellets and measured for hysteresis of magnetization using a SQUID magnetometer. From the measurement was calculated a Jc ($A/cm^2$) at a magnetic field of 1T at a temperature of 77K. The calculation results of Jc and its ranges expressed in i are shown in Table 1

TABLE 1

| Sample No. | Content of Pt (Wt. %) | Jc ($A/cm^2$) |
|---|---|---|
| 1-1 | 0.0000 | 2800 ± 150 |
| 1-2 | 0.0025 | 3300 ± 170 |
| 1-3 | 0.0050 | 3200 ± 140 |
| 1-4 | 0.0075 | 3200 ± 110 |
| 1-5 | 0.0100 | 8700 ± 180 |
| 1-6 | 0.0125 | 11000 ± 250 |
| 1-7 | 0.0150 | 9200 ± 230 |
| 1-8 | 0.0175 | 9800 ± 230 |
| 1-9 | 0.02 | 10000 ± 310 |
| 1-10 | 0.05 | 11000 ± 200 |
| 1-11 | 0.10 | 12000 ± 190 |
| 1-12 | 0.50 | 12000 ± 230 |
| 1-13 | 1.00 | 14000 ± 420 |
| 1-14 | 2.00 | 16000 ± 500 |
| 1-15 | 3.00 | 11000 ± 260 |
| 1-16 | 4.50 | 9900 ± 270 |
| 1-17 | 4.75 | 9500 ± 240 |
| 1-18 | 5.00 | 9000 ± 320 |
| 1-19 | 5.25 | 3400 ± 200 |
| 1-20 | 5.50 | 3300 ± 210 |
| 1-21 | 5.75 | 3400 ± 220 |
| 1-22 | 6.00 | 3100 ± 160 |

Example 2

A calcined powder was obtained in the same manner as in Example 1 except that $Gd_2O_3$ was used in place of $Y_2O_3$ so that the atomic ratio of Gd, Ba and Cu became 1.3 : 2.0: 3.0.

To the calcined powder was added a rhodium (Rh) powder having an average particle diameter of 15 mm, so that the fired body (oxide superconducting material) has the content of Pt in term of element as shown in Table 2, and mixed powders were prepared in the same manner as in Example 1 and then shaped into pellets of 7 mm in thickness and 20 mm in diameter in the same manner as in Example 1.

The pellets were treated in the same manner as in Example 1 except that they were kept at 1120° C. for 1 hour to give rise to Incongruent melting point and then cooled slowly from 980° C. to 930° C. in 50 hours, whereby oxide superconducting materials in pellet form were obtained.

The microstructure of the crystal of the oxide superconducting material of sample No. 2-12 in pellet form was the same as that of FIG. 1 of Example 1.

In the same manner as in Example 1, five samples each were cut out from the pellets of the oxide superconducting materials and measured for hysteresis of magnetization to calculate the Jc ($A/cm^2$) of each oxide superconducting material at a magnetic field of 1T at a temperature of 77K. The calculation results of Jc and its ranges expressed in ± are shown in Table 2.

TABLE 2

| Sample No. | Content of Rh (Wt. %) | Jc ($A/cm^2$) |
|---|---|---|
| 2-1 | 0.0000 | 3600 ± 260 |
| 2-2 | 0.0025 | 3200 ± 270 |
| 2-3 | 0.0050 | 4000 ± 340 |
| 2-4 | 0.0075 | 3000 ± 150 |
| 2-5 | 0.0100 | 9000 ± 380 |
| 2-6 | 0.0125 | 9100 ± 330 |
| 2-7 | 0.0150 | 8900 ± 310 |
| 2-8 | 0.0175 | 12000 ± 350 |
| 2-9 | 0.02 | 11000 ± 370 |
| 2-10 | 0.05 | 10000 ± 240 |
| 2-11 | 0.10 | 10000 ± 280 |
| 2-12 | 0.50 | 11000 ± 330 |
| 2-13 | 1.00 | 10000 ± 420 |
| 2-14 | 2.00 | 13000 ± 360 |

TABLE 2-continued

| Sample No. | Content of Rh (Wt. %) | Jc (A/cm$^2$) |
| --- | --- | --- |
| 2-15 | 3.00 | 8900 ± 360 |
| 2-16 | 4.50 | 12000 ± 270 |
| 2-17 | 4.75 | 9900 ± 430 |
| 2-18 | 5.00 | 13000 ± 260 |
| 2-19 | 5.25 | 2800 ± 320 |
| 2-20 | 5.50 | 3700 ± 250 |
| 2-21 | 5.75 | 2900 ± 330 |
| 2-22 | 6.00 | 3000 ± 360 |

Example 3

BaCO$_3$ and CuO powders were weighed so that the atomic ratio of Ba and Cu became 1 : 1, mixed and calcined in an oxygen flow at 1000° C. for 10 hours. The calcined product was ground in isopropyl alcohol in a rotary mill containing zirconia flint pebbles, for 10 hours to obtain a barium-copper oxide compound powder having an average particle diameter of about 5 mm.

To the powder were added copper oxide and, as a rare earth element oxide (RE$_2$O$_3$), one of Dy$_2$O$_3$, Ho$_2$O$_3$, Er$_2$O$_3$ and Yb$_2$O$_3$ so that the atomic ratio of RE: Ba: Cu became 1.8: 2.4 : 3.4. To the resulting powder was added a platinum powder having an average particle diameter of about 1 μm, so that the fired body (oxide superconducting material) has the content of Pt in term of element as shown in Tables 3–6. They were mixed and press-molded to obtain pellets of 10 mm in thickness and 20 mm in diameter. The pellets were placed in an electric furnace containing the air, and kept for 30 minutes under the following temperature conditions which differed depending upon the kind of rare earth element.

1150° C. (Dy$_2$O$_3$, Ho$_2$O$_3$)
1100° C. (Er$_2$O$_3$)
1050° C. (Yb$_2$O$_3$)

The resulting pellets were cooled slowly for 100 hours in the following temperature range.

1000° C. to 900° C. (Dy$_2$O$_3$, Ho$_2$O$_3$)
950° C. to 850° C. (Er$_2$O$_3$)
900° C. to 800° C. (Yb$_2$O$_3$)

The pellets were further heat-treated at 500°–300° C. for 50 hours in the same furnace with the atmosphere changed to oxygen, to obtain oxide superconducting materials in pellet form.

In the same manner as in Example 1, 5 samples each were cut out from the pellets of the oxide superconducting materials and measured for hysteresis of magnetization to calculate the Jc (A/cm$^2$) of each oxide superconducting material at a magnetic field of 1T at a temperature of 77K. The calculation results of Jc and its ranges expressed in ± are shown in Tables 3–6.

TABLE 3

| Sample No. | Rare earth element | Content of Pt (Wt. %) | Jc (A/cm$^2$) |
| --- | --- | --- | --- |
| 3-1 | Dy | 0.0000 | 4000 ± 220 |
| 3-2 | Dy | 0.05 | 4400 ± 180 |
| 3-3 | Dy | 0.1 | 9600 ± 300 |
| 3-4 | Dy | 0.5 | 9500 ± 260 |
| 3-5 | Dy | 2 | 9800 ± 350 |
| 3-6 | Dy | 4 | 9500 ± 320 |
| 3-7 | Dy | 5 | 9000 ± 110 |
| 3-8 | Dy | 5.5 | 6600 ± 270 |
| 3-9 | Dy | 6 | 5300 ± 310 |

TABLE 4

| Sample No. | Rare earth element | Content of Pt (Wt. %) | Jc (A/cm$^2$) |
| --- | --- | --- | --- |
| 4-1 | Ho | 0.0000 | 3800 ± 260 |
| 4-2 | Ho | 0.05 | 4500 ± 300 |
| 4-3 | Ho | 0.1 | 8900 ± 240 |
| 4-4 | Ho | 0.5 | 9500 ± 370 |
| 4-5 | Ho | 2 | 10000 ± 310 |
| 4-6 | Ho | 4 | 11000 ± 270 |
| 4-7 | Ho | 5 | 9000 ± 250 |
| 4-8 | Ho | 5.5 | 6500 ± 110 |
| 4-9 | Ho | 6 | 4200 ± 370 |

TABLE 5

| Sample No. | Rare earth element | Content of Pt (Wt. %) | Jc (A/cm$^2$) |
| --- | --- | --- | --- |
| 5-1 | Er | 0.0000 | 4500 ± 330 |
| 5-2 | Er | 0.05 | 4300 ± 210 |
| 5-3 | Er | 0.1 | 8800 ± 320 |
| 5-4 | Er | 0.5 | 9000 ± 380 |
| 5-5 | Er | 2 | 9200 ± 200 |
| 5-6 | Er | 4 | 9300 ± 190 |
| 5-7 | Er | 5 | 8500 ± 300 |
| 5-8 | Er | 5.5 | 6400 ± 270 |
| 5-9 | Er | 6 | 5200 ± 190 |

TABLE 6

| Sample No. | Rare earth element | Content of Pt (Wt. %) | Jc (A/cm$^2$) |
| --- | --- | --- | --- |
| 6-1 | Yb | 0.0000 | 3300 ± 150 |
| 6-2 | Yb | 0.05 | 4100 ± 260 |
| 6-3 | Yb | 0.1 | 8300 ± 390 |
| 6-4 | Yb | 0.5 | 8800 ± 230 |
| 6-5 | Yb | 2 | 8500 ± 180 |
| 6-6 | Yb | 4 | 9000 ± 410 |
| 6-7 | Yb | 5 | 8900 ± 370 |

What is claimed is:

1. A process for producing a rare earth oxide superconducting material which is a matrix of grains of REBa$_2$Cu$_3$O$_y$, where RE is Y, Gd, Dy, Ho, Er or Yb, having fine particles of RE$_2$BaCuO$_5$ uniformly dispersed in said grains and at least one element selected from Rh and Pt, contained in said grains in a proportion of 0.01–5% by weight in terms of the element based on the rare earth oxide superconducting material, which process comprises: adding, to powders of: (1) an oxide of RE, (2) an oxide or carbonate of Ba, and (3) an oxide of Cu, as raw materials for said REBa$_2$Cu$_3$O$_y$ and RE$_2$BaCuO$_5$, at least one element selected from Rh and Pt or at least one compound thereof in an amount of 0.01–5% by weight, in terms of the element, based on the rare earth oxide superconducting material to be finally obtained; shaping the resulting mixture; subjecting the shaped material to a heat treatment at a temperature equal to or higher than the incongruent melting point of the REBa$_2$Cu$_3$O$_y$ oxide superconducting material; and subjecting the resulting material to slow cooling and a heat treatment to obtain a rare earth oxide superconducting material having a critical current density of at least 8700 A/cm$^2$ at 77K under one test.

2. A process according to claim 1, wherein the raw material powders have particle diameters of 2–20 μm.

3. A process according to claim 1 or 2, wherein the at least one element selected from Rh and Pt or the at least one compound thereof is a powder of a single metal element.

4. A process according to claim 1, wherein the at least one element selected from Rh and Pt or the at least one compound thereof is a fine powder having particle diameters of 20 μm or less.

5. A process according to claim 1 or 2 wherein the slow cooling is conducted at a cooling rate of 1°–5° C./hr.

6. A process according to claim 2, wherein the final heat treatment is conducted in an oxygen atmosphere at 650°–400° C. for 10–50 hours.

7. A process according to claim 1 wherein the amount of said at least one element selected from Rh and Pt is 0.05–3% by weight.

8. A process according to claim 1, wherein said rare earth oxide superconducting material has a critical current density of at least 11000 A/cm$^2$ at 77K under one tesla.

9. A process according to claim 1 wherein Rh or a compound thereof is added to said powders.

10. A rare earth oxide superconducting material, comprising:

a matrix of grains of $REBa_2Cu_3O_y$, wherein RE is selected from the group consisting of Y, Gd, Dy, Ho, Er, or Yb, fine particles of $RE_2BaCuO_5$ uniformly dispersed in said grains; and at least one element from the group consisting of Rh and Pt in said grains of $REBa_2Cu_3O_y$ in a proportion of 0.01–5% by weight in terms of said element based on said rare earth oxide superconducting material, said rare earth oxide superconducting material having a critical current density of at least 8700 A/cm$^2$ at 77K under one tesla.

11. A rare earth oxide superconducting material according to claim 10 wherein the amount of said at least one element from the group consisting of Rh and Pt is 0.05–3% by weight.

12. A rare earth oxide superconducting material according to claim 10 wherein said rare earth oxide superconducting material has a critical current density of at least 11000 A/cm$^2$ at 77K under one tesla.

13. A rare earth oxide superconducting material according to claim 10 wherein said at least one element is Rh.

* * * * *